SEMICONDUCTOR DEVICES HAVING A FIELD EFFECT TRANSISTOR STRUCTURE

Filed May 1, 1967

3 Sheets-Sheet 1

INVENTOR.
ALFONS M.R. VAN IERSEL
BY
Frank R. Trifari
AGENT

Dec. 2, 1969 A. M. R. VAN IERSEL 3,482,152

SEMICONDUCTOR DEVICES HAVING A FIELD EFFECT TRANSISTOR STRUCTURE

Filed May 1, 1967 3 Sheets-Sheet 2

INVENTOR.
ALFONS M.R. VAN IERSEL
BY
Frank R. Trifari
AGENT

SEMICONDUCTOR DEVICES HAVING A FIELD EFFECT TRANSISTOR STRUCTURE

Filed May 1, 1967 3 Sheets-Sheet 3

INVENTOR.
ALFONS M.R. VAN IERSEL
BY
[signature]
AGENT

United States Patent Office 3,482,152

Patented Dec. 2, 1969

3,482,152

SEMICONDUCTOR DEVICES HAVING A FIELD EFFECT TRANSISTOR STRUCTURE

Alfons Matthijs Reinier van Iersel, Nijmegen, Netherlands, assignor, by mesne assignments, to U.S. Philips Corporation, New York, N.Y., a corporation of Delaware Filed May 1, 1967, Ser. No. 635,091
Claims priority, application Netherlands, May 17, 1966, 6606714
Int. Cl. H01l *11/14*
U.S. Cl. 317—235 8 Claims

ABSTRACT OF THE DISCLOSURE

A semiconductor device including a field-effect transistor of the junction type in which a shielding layer is provided within the device underneath the contact layer for one of the source and drain electrodes and connected to the other of the source and drain electrodes, which minimizes the effect of a feedback capacitance and thus improves the high frequency performance of the transistor. In a preferred embodiment, the shielding layer is a surface diffused region of the semiconductor of the same conductivity type as that of the source and drain regions.

This invention relates to semiconductor devices having a semiconductor body comprising a part of one conductivity type covered with an insulating layer and having formed in it a field effect transistor. The transistor includes structure the source and drain of which each comprise an electrode region consisting of a surface region of the opposite conductivity type which is adjacent to the insulating layer, and a metal layer located on the insulating layer and to which a connecting conductor is connected. The said metal layer is connected to the electrode region through an aperture in the insulating layer and extend over the part of the one conductivity type, and the electrode regions are connected to each other by a channel region of the opposite conductivity type which is thinner than the electrode regions. At least one gate electrode is provided which comprises a region of the one conductivity type adjacent to the channel region, while the part of the one conductivity type belongs to a gate electrode of the field effect transistor. The invention also relates to a method of manufacturing such a semiconductor device and to a circuit including such a semiconductor device.

A field effect transistor may be used for amplifying electrical signals in which, for example, the source is common to the input and output of the circuit, while the electrical signals to be amplified are applied to the gate electrode and the amplified signals are derived from the drain. The metal layer belonging to the drain and located on the insulating layer then constitutes a capacitance with the part of the one conductivity type located under the insulating layer and belonging to the gate electrode.

The present invention underlies inter alia recognition of the fact that the said capacitance causes feedback, thus limiting the amplification possible by the semiconductor device, especially at high frequencies, and that the said capacitance causing feedback may be eliminated at least substantially in a simple manner.

Especially in field effect transistors intended for amplifying signals of high frequencies, the metal layers are necessary for connecting supply conductors thereto, since in view of parasitic capacitances the electrode regions are small so that supply conductors cannot be connected directly to the electrode regions themselves.

An object of the invention is inter alia to provide a semiconductor device of the kind mentioned in the preamble in which the said capacitance causing feedback is eliminated at least substantially.

According to the invention a semiconductor device of the kind mentioned in the preamble is characterized in that the area of the insulating layer covered by one of the metal layers lies, at least in part, on a conductive shielding or shield layer, a barrier layer being present between the shielding layer and the part of the one conductivity type, while means are provided for electrically connecting the shielding layer to the other metal layer.

When the semiconductor device according to the invention is used for amplifying electrical signals, for example, in the manner described, the shielding layer lying beneath the metal layer belonging to the drain and being electrically connected to the metal layer belonging to the source, then at least a great proportion of the said capacitance causing feedback is replaced by a capacitance between the source and drain and by a (diode) capacitance between the source and the gate electrode. The latter capacitances are not troublesome or at least to a much lesser extent than the capacitance causing feedback.

The shielding layer may be a metal layer, the barrier layer being an insulating layer, for example of silicon oxide or silicon nitride, applied to the semiconductor body.

One important preferred embodiment is characterized in that the shielding layer consists of a surface region of the opposite conductivity type, the barrier layer being the p-n junction formed by the said surface region and the part of the one conductivity type. This affords the advantage that, during the manufacture of this embodiment, the shielding layer may be obtained simultaneously with the electrode regions by diffusion of an activator and that, as will appear hereinafter, a very advantageous electrical connection between the shielding layer and the other metal layer becomes possible.

The shielding layer may be electrically connected to the other metal layer in various ways. The semiconductor devices may be provided, for example, with an envelope which houses the semiconductor body and in which supply conductors connected to the metal layers and the gate electrode are led through the envelope to the exterior, while a supply conductor connected to the shielding layer is led out through the envelope and connected outside the envelope to the supply conductor of the other metal layer.

The connection may alternatively be made inside the envelope and it is then not necessary to connect an additional supply conductor for the shielding layer.

The shielding layer may advantageously be connected to the other metal layer by means of a metal conductor provided on the insulating layer.

If the shielding layer consists of a surface region of the opposite conductivity type the electrical connection may be made with great advantage inside the semiconductor body and an important preferred embodiment in which the shielding layer consists of a surface region is therefore characterized in that the other metal layer is electrically connected to the shielding layer through the electrode region connected to said metal layer and a connecting region which connects said electrode region to the shielding layer and consists of a surface region of the opposite conductivity type. This generally makes possible a compact structure, while during the manufacture of the device the electrode regions, the shielding layer and the connecting region may be formed simultaneously, for example, by diffusion of an activator.

One embodiment of a semiconductor device according to the invention which has been found very advantageous in practice is characterized in that at least three electrode regions located side by side are present which are connected alternately to one and the other metal layer, the metal layers forming an interdigital pattern and a channel region being present between each two sequential electrode regions, the electrode regions connected to the other metal layer being connected through connecting regions to the shielding layer located beneath the one metal layer. The electrical properties of such an embodiment are very favourable and a compact geometry is possible.

A channel region preferably lies beneath a surface region of the one conductivity type which is contiguous with the part of the one conductivity type and thus pertains to the gate electrode. Consequently the channel region between two electrode regions is entirely surrounded by the gate electrode which favourably affects the electrical properties of the device.

It should be noted that more than one gate electrode may be present; the channel region may lie, for example, between two gate electrode regions which may be connected individually.

The invention also relates to a circuit for amplifying electrical signals, including a semiconductor device according to the invention, which is characterized in that the shielding layer and the other metal layer are common to the input and output of the circuit, the signals to be amplified being applied to the gate electrode and the amplified signals being derived from the one metal layer under which the shield layer is present.

The invention also relates to a method of manufacturing a semiconductor device according to the invention which is characterized in that the part of the one conductivity type with the regions of the opposite conductivity type is obtained by using a starting semiconductor body consisting of a substrate of the one conductivity type to which an epitaxial layer of the opposite conductivity type is applied having a higher resistivity than the substrate, whereupon the conductivity type of the epitaxial layer is changed from the opposite type to the one conductivity type by diffusion of activators into the surface of the epitaxial layer during which process parts of this surface are masked against diffusion of the activators, said change of conductivity type not taking place in areas of the layer determined by the masking and forming the regions of the opposite conductivity type. The part of the one conductivity type with the regions of the opposite conductivity type is thus obtained in a very simple manner, the regions of the opposite conductivity type having a higher resistivity than the adjacent substrate of the one conductivity type. The latter is important especially for the channel region in view of favourable electrical properties of the semiconductor device.

It is also possible to use a starting semiconductor body which is entirely of the one conductivity type and to form the regions of the opposite conductivity type by diffusion of activators causing the opposite conductivity type. However, the formation of regions of the opposite conductivity type having a resistivity higher than that of the surrounding part of the one conductivity type is then much more difficult.

In order that the invention may be readily carried into effect embodiments thereof will now be described in detail, by way of example, with reference to the accompanying diagrammatic drawings, in which.

Figures 1, 2:
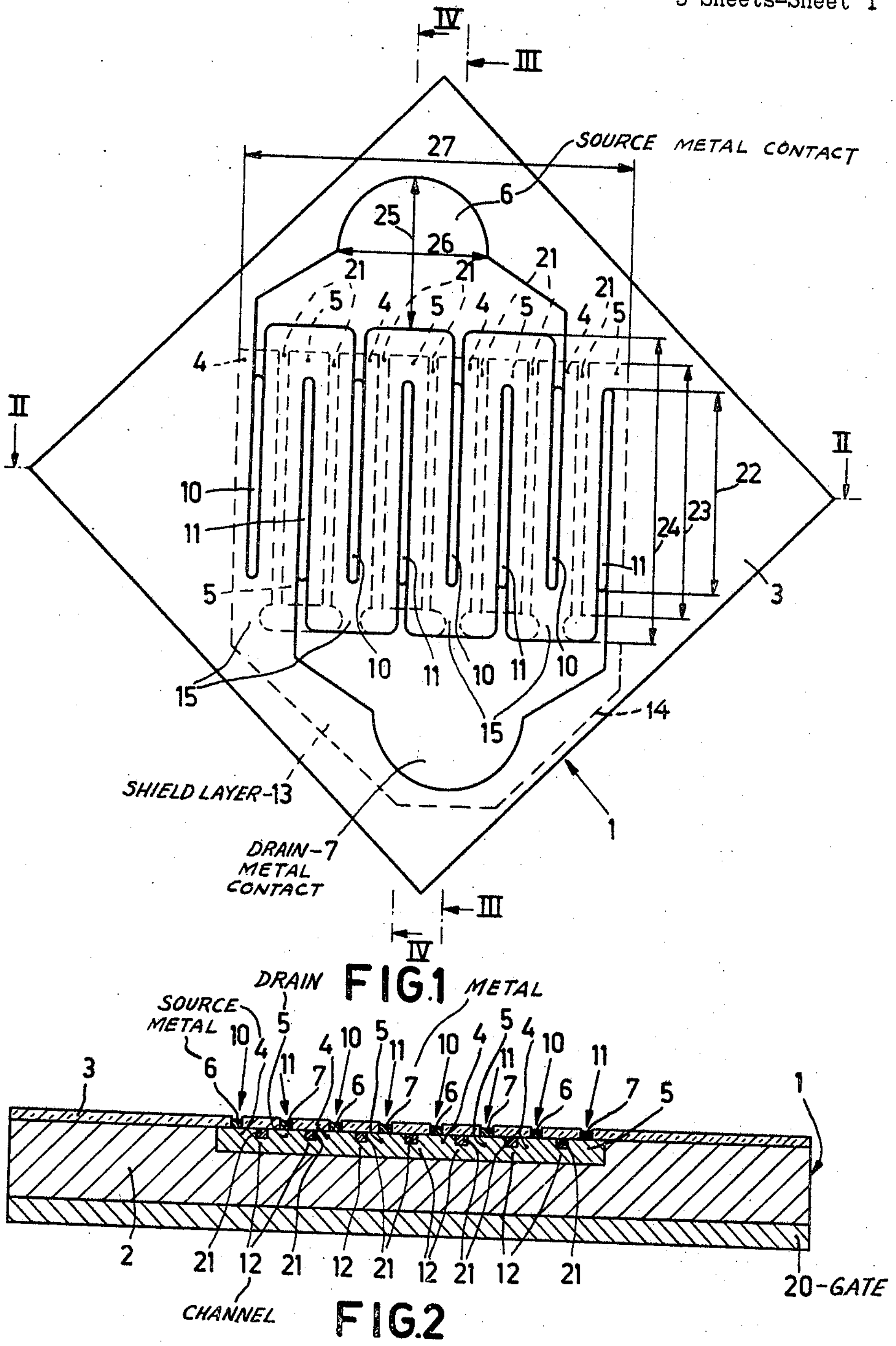
FIGURE 1 is a plan view of one embodiment of a semiconductor device having a field effect transistor structure according to the invention.
FIGURE 2 is a cross-sectional view taken on the line II—II of FIGURE 1.

The semiconductor device of FIGURES 1 to 4 comprises a semiconductor body 1 having a part 2 of one conductivity type which is covered with an insulating layer 3. The part 2 includes a field effect transistor structure the source and drain of which each comprise an electrode region 4, in this example a plurality of electrode regions 4, and an electrode region 5, in this example a plurality of electrode regions 5, comprising surface regions of the opposite conductivity type which are adjacent to the insulating layer 3, and metal layers 6 and 7, respectively, located on the insulating layer 3 and to which connecting conductors 8 and 9, respectively, are connected (shown only in FIGURE 3 for the sake of clarity) and which are connected to the electrode regions 4 and 5 through apertures 10 and 11, respectively, in the insulating layer 3. The metal layers 6 and 7 extend over the part 2 of one conductivity type. The electrode regions 4 and 5 are connected together by a channel region 12 which is thinner than the electrode regions 4 and 5. The part 2 of one conductivity type pertains, together with a metal carrier plate 20, to the gate electrode of the field effect transistor structure.

It is to be noted that the regions located beneath the insulating layer 3 and adjacent thereto are indicated by broken lines in FIGURE 1.

According to the invention the part of the insulating layer 3 which is covered by the one metal layer 7 lies substantially on a conductive shield or shielding layer 13, a barrier layer 14 being present between the shielding layer and the part 2. In the present example, the shielding layer 13 comprises a surface region of the opposite conductivity type, the barrier layer 14 being the p-n junction formed between the layer 13 and the part 2.

Figure 3:
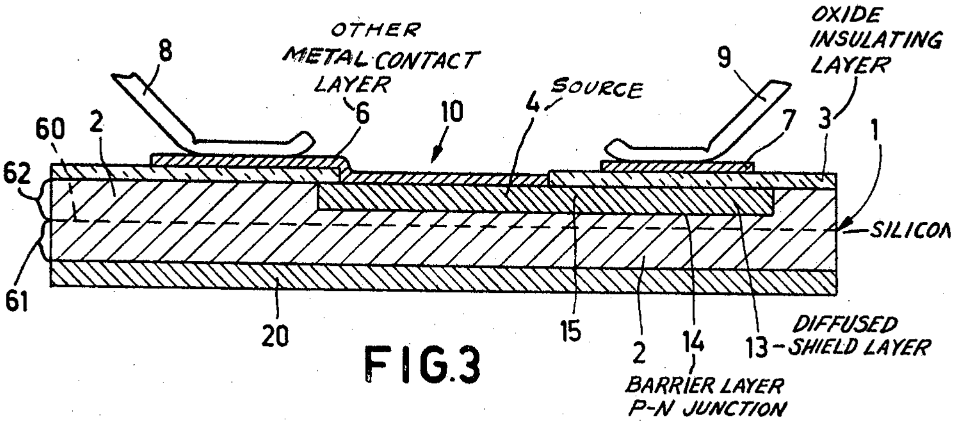
FIGURE 3 is a cross-sectional view taken on the line III—III of FIGURE 1.
Figure 4:
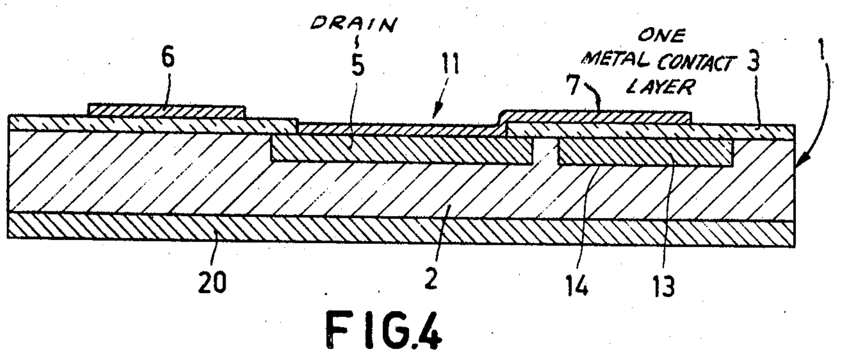
FIGURE 4 is a cross-sectional view taken on the line IV—IV of FIGURE 1.

According to the invention, means are also provided for electrically connecting the shielding layer 13 to the other metal layer 6. In the present example, the other metal layer 6 is electrically connected to the shielding layer 13 through the electrode regions 4, connected to the metal layer 6, and connecting regions 15 which connect said regions to the shielding layer 13 and comprise surface regions of the opposite conductivity type. Thus, the electrode regions 4, the connecting region 15, and the shield 13 are integral with one another, as shown in FIG. 3.

Since the electrode regions 4 and 5, the connecting regions 15 and the shielding layer 13 have the same conductivity type they can be manufactured simultaneously by diffusion of an activator, while no further steps are necessary for connecting the other metal layer 6 to the shield layer 13. Further, the device of FIGURES 1 to 4 has a compact geometry and this is possible inter alia because no connecting conductors need be connected to the shielding layer 13.

The shielding layer 13 permits the capacitance between the metal layer 7 and the part 2 (the gate electrode), which causes feedback during the operation of the device, to be eliminated substantially, as will be described more fully hereinafter.

The device includes an even number (eight) of electrode regions which lie side by side and are connected alternately to the one metal layer 6 (the electrode regions 4) and to the other metal layer 7 (the electrode regions 5), the metal layers 6 and 7 forming an interdigital pattern and a channel region 12 being present between each two sequential electrode regions 4 and 5. Each electrode region 4 connected to the other metal layer 6 is connected by a connecting region 15 to the shielding layer 13 located beneath the one metal layer 7. This geometry makes possible very advantageous electrical properties of the device, while the use of a plurality of juxtaposed regions enhances a compact structure.

The channel regions 12 are located under surface regions 21 of one conductivity type which are adjacent to the part 2 of one conductivity type and thus pertain to the gate electrode 2, 20, 21. In a section through the region at right angles to the plane of drawing in FIGURE 2, a channel region 12 is thus entirely surrounded by the region 2, 21 pertaining to the gate electrode, which favourably affects the electrical properties of the device.

If the regions 21 are absent, the channel region 12 then having the same thickness as the electrode regions 4 and 5, these electrode regions form, together with the channel regions 12, the connecting regions 15 and the shielding layer 13, a coherent pattern of surface regions and during the manufacture said regions may be formed simultaneously by providing a surface region having this coherent pattern in the part 2, for example, by diffusion of an activator. Subsequently the regions 21 may be formed simultaneously by diffusion of another activator. All the desired regions are thus obtained in only two diffusion treatments.

Now the manufacture of the embodiment shown in FIGURES 1 to 4 will be described.

It is possible to start from a thin monocrystalline silicon plate of one conductivity type covered with a silicon oxide layer, the last-mentioned layer to form in an aperture corresponding to the said coherent pattern formed by the regions 4, 5, 12 and 15, and to provide the diffused regions of the opposite conductivity type by diffusion of an activator. However, it is then difficult to obtain regions having a resistivity higher than that of the surrounding part of one conductivity type. For this reason one preferably proceeds as follows:

Start is made from a p-type silicon body subtrate having dimensions of approximately 240$\mu$ x 450$\mu$ x 450$\mu$ and a resistivity of approximately 0.2 $\Omega$cm., on which an epitaxial n-type silicon layer is formed having a resistivity of approximately 2 $\Omega$cm. and a thickness of approximately 5$\mu$, the epitaxial silicon layer being covered by a silicon oxide layer of, for example, approximately 0.2$\mu$ thick.

The silicon oxide layer is selectively etched away in a manner as usually employed in the semiconductor technique, for example with the aid of a photo-resist and an etchant, a portion of the oxide layer which subsists having a shape corresponding to the aforementioned coherent pattern of the regions 4, 5, 12, 13 and 15.

The portion of the epitaxial layer which is no longer covered by the oxide layer is subsequently given p-type conduction by diffusing a p-type activator, for example boron, into the surface of the epitaxial layer in a usual manner, whereafter the part of the epitaxial layer under the oxide layer which has not changed its conductivity type forms the coherent pattern of the regions 4, 5, 12, 13 and 15.

Subsequently the p-type surface regions 21, which are adjacent to the p-type part 2, are formed in a usual manner by diffusion of a p-type activator, such as boron, using conventional masking techniques.

The junction surface between the substrate and the epitaxial layer is indicated by a broken line 60 in FIGURE 3 only for the sake of simplicity, the substrate and the epitaxial layer being designated 61 and 62 respectively.

The n-type regions (15, 13 in FIGURE 3) are slightly thinner than the epitaxial layer 62 since, during the diffusion treatment, diffusion from the substrate into the epitaxial layer takes place.

The n-type regions 4, 5, 13 and 15 ultimately claimed are approximately 3.5$\mu$ thick, the channel regions 12 are approximately 1.5$\mu$ thick and the p-type regions 21 are approximately 2$\mu$ thick.

Next, steps are taken that the whole surface area of the epitaxial layer 62 is again covered with a silicon oxide layer, whereupon the apertures 10 and 11 are formed in the oxide layer 3. A low-ohmic n-type layer of approximately 1$\mu$ thick adjacent to the apertures is obtained by diffusion of an n-type activator, for example phosphorus, in order to permit satisfactory contacting with the metal layers to be provided. The apertures are cleaned, whereupon an aluminum layer of approximately 0.4$\mu$ thick is applied, for example by vapour deposition, over the oxide layer 3 and in the apertures 10 and 11. Parts of the aluminum layer are removed again by selective etching, whereby the interdigital metal layers 6 and 7 subsist.

In a manner as usually employed in the semiconductor technique, the silicon plate 1 is secured to a metallic carrier 20, for example, by soldering and/or alloying, which carrier may serve as a terminal contact for the gate electrode. It will be evident that a connecting conductor may also be connected to the region 2, 21 pertaining to the gate electrode through an aperture in the insulating layer 3.

Also in a conventional manner, for example, wire-shaped connecting conductors 8 and 9 are connected to the metal layers 6 and 7, for example, by pressure bonding.

The dimensions indicated by arrows 22 to 27 in FIGURE 1 are approximately 112$\mu$, 140$\mu$, 180$\mu$, 100$\mu$, 100$\mu$, and 204$\mu$ respectively.

In FIGURE 2 the regions 21 are approximately 4$\mu$ wide. The width of the apertures 10 and 11 is approximately 6$\mu$.

The device of FIGURES 1 to 4 may be incorporated in an envelope in the usual manner.

Figure 5:
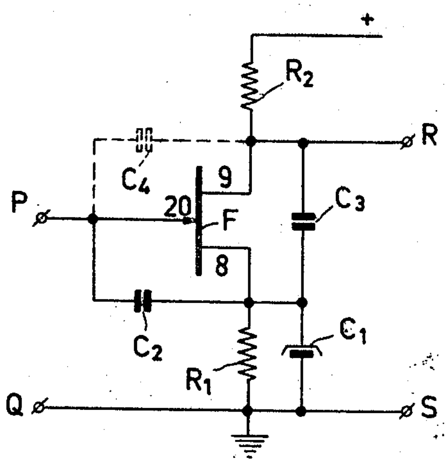
FIGURE 5 shows a circuit according to the invention including a semiconductor device according to the invention.

FIGURE 5 shows one embodiment of a circuit according to the invention including a semiconductor device F according to the embodiment described. The connecting conductors of the semiconductor device have the same reference numerals in FIGURE 5 as in FIGURES 1 to 4.

The connecting conductor 8 is connected to a reference potential, in this example earth, through a resistor $R_1$ of approximately 3 k$\Omega$ which is decouped by a capacitor $C_1$. The connecting conductor 9 is connected to a positive voltage of approximately 15 volts through a resistor $R_2$ of approximately 5 k$\Omega$.

The input and output circuits, the details of which are not essential to the invention, are connected to terminals P, Q and terminals R, S respectively.

The shielding layer 13 and the other metal layer 6 are thus common to the input and output circuits via the connecting conductor 8, while the signals to be amplified are applied to the gate electrode having the regions 2 and 21 via the connecting conductor 20 and the amplified signals are derived, via the connecting conductor 9, from the one metal layer 7 under which the shielding layer 13 is present.

The capacity $C_2$ is the (diode) capacitance formed by the shileding layer 13 and the part 2 of the gate electrode, and the capacity $C_3$ is the capacitance between the metal layer 7 and the shielding layer 13. Said capacitances are usually not troublesome in practice.

If the shielding layer 13 were not present a capacity $C_4$ instead of the capacities $C_2$ and $C_3$ would occur between the metal layer 7 and the part 2 of the gate electrode. This capacity $C_4$ causes feedback and thus limits the gain factor possible.

It has been found that, in the embodiment described but without the shielding layer 13, the total capacity causing feedback is approximately 1.4 pf. and, if the shielding layer is present, is 0.5 pf. so that amplification to approximately three times higher frequencies becomes possible.

Figure 6:
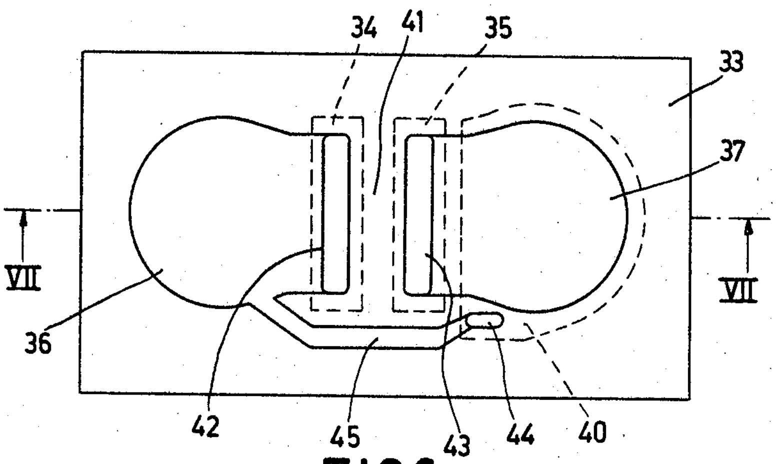
FIGURE 6 is a plan view of another embodiment of a semiconductor device according to the invention.
Figure 7:
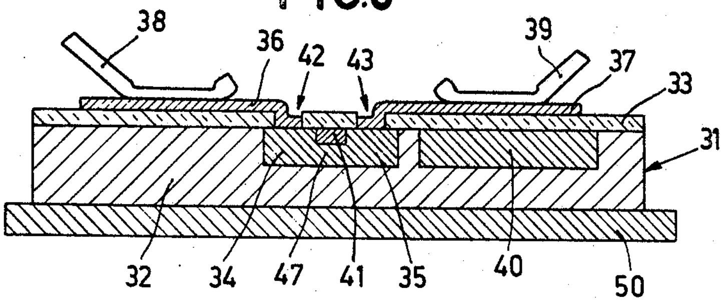
FIGURE 7 is a cross-sectional view taken on the line VII—VII of FIGURE 6.

With reference to FIGURES 6 and 7 one embodiment of a semiconductor device according to the invention will now be described in which the shielding layer is connected to the other metal layer outside the semiconductor body.

A semiconductor body 31 includes a part 32 of one conductivity type in which electrode regions 34 and 35 of the opposite conductivity type are formed and connected by a channel region 47 of the opposite conductivity type which lies beneath a surface region 41 of one conductivity type. The region 41 is adjacent to the part 32.

An insulating layer 33 is provided with apertures 42 and 43 through which metal layers 36 and 37 located on the insulating layer 33 are connected to the electrode regions 34 and 35.

A shielding layer 40 consisting of a surface region of the opposite conductivity type is formed under the one metal layer 37 and the insulating layer 33.

The shielding layer 40 is electrically connected to the other metal layer 36 with the aid of a metal conductor 45 which is formed on the insulating layer 33 and which contacts with the shielding layer 40 through an aperture 44 in the insulating layer 33.

Connecting conductors 38 and 37, shown only in FIGURE 7 for the sake of clarity, are connected to the metal layers 36 and 37, while the semiconductor body is secured to a metallic carrier 50 which may serve as a connecting conductor for the regions 32 and 41 of the gate electrode.

The embodiment of FIGURES 6 and 7 may be manufactured in a similar manner and be included in a circuit in a similar manner as has been described with reference to the previous example.

It should be noted that surface regions adjacent to the insulating layer 33 are indicated by broken lines.

Figure 8:
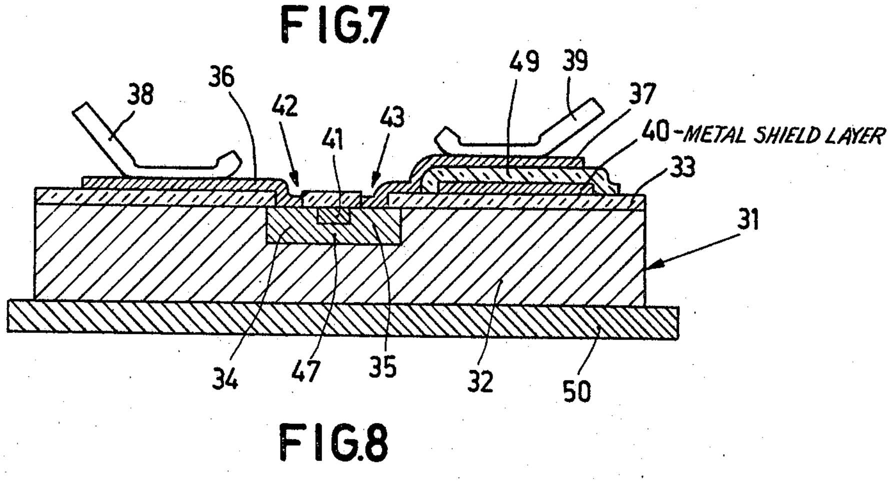
FIGURE 8 is a cross-sectional view of an embodiment which is slightly modified relative to that of FIGURES 6 and 7.

A shielding layer consisting of a metal layer can be used instead of the shielding layer 40 consisting of a surface region of the semiconductor body 31. The plan view of FIGURE 6 then remains substantially unchanged, whereas the cross-section of FIGURE 7 is replaced by that of FIGURE 8. The shielding layer 40 is a metal layer which is applied to the insulating layer 33 and which itself is covered by an insulating layer 49 which carried the metal layer 37. The aperture 44 is in this case formed in an insulating layer 49. The insulating layer 33 constitutes the barrier layer between the shielding layer 40 and the part 32.

If the shielding layer 40 is of aluminum the insulating layer 49 may be of, for example, aluminum oxide. The insulating layer 49 may alternatively consist of a photoresist or a material such as silicon oxide.

It will be evident that the invention is not confined to the embodiments described and that numerous modifications are possible to a man skilled in the art within the scope of the invention. Thus a connecting conductor, for example wire-shaped, may be connected to the shielding layer through an aperture in the insulating layer covering the shielding layer and be led through the envelope of the semiconductor device to the exterior, the electrical connection to the other metal layer being made by connecting said connecting conductor outside the envelope to the connecting conductor of the said metal layer. The semiconductor body may consist of a semiconductor material other than silicon, for example, germanium or an $A_{III}B_V$ compound. Further, circuits other than the circuit described, in which the shielding layer is efficaciously used, will be possible for a man skilled in the art. Also, the semiconductor body of a semiconductor device according to the invention can include, in addition to the field effect transistor structure, a further switching element, for example a resistor. A semiconductor device according to the invention can comprise more than one gate electrode. Thus the channel region may lie, for example, between two regions pertaining to different gate electrodes.

What is claimed is:

1. A semiconductor device comprising a body including a semiconductive portion of one conductivity type, said semiconductive portion including a surface region of the opposite conductivity type forming a p-n junction with the said semiconductive portion, spaced surface zones of said opposite type surface region constituting source and drain electrodes of a field effect transistor, said source and drain surface zones being separated by a channel region of said opposite type conductivity having a thickness dimension measured orthogonally to the surface that is smaller than the corresponding dimension of the source and drain surface zones, an insulating layer on the surface and having openings over the source and drain surface zones, a first contact metal layer on the insulating layer and connected through an opening to the source surface zone, a second contact metal layer on the insulating layer and connected through an opening to the drain surface zone, at least one of the first and second metal layers extending over and overlying the semiconductive body portion of one conductivity type and forming an undesired capacitance, a conductive shielding layer in the body and underlying a substantial part of the portion of said one metal layer overlying the semiconductive body portion of one conductivity type but electrically insulated from said one metal layer, means forming a barrier layer between the said shielding layer and the said semiconductive body portion of one conductivity type, a first source connection to said first metal layer, a second drain connection to said second metal layer, a third connection to said semiconductive body portion of one conductivity type constituting a gate connection of the field effect transistor, and means for electrically connecting the said shielding layer to the other of said first and second metal layers thereby minimizing the effect of said undesired capacitance.

2. A semiconductor device as claimed in claim 1 wherein the shielding layer is a metal layer, and the barrier layer is an insulating layer formed on the semiconductive portion.

3. A semiconductor device as claimed in claim 1 wherein the shielding layer comprises a semiconductive surface region of the opposite conductivity type, and the barrier layer is a p-n junction formed by the said surface region and the portion of the one conductivity type.

4. A semiconductor device as claimed in claim 1 wherein the shielding layer is electrically connected to the said other metal layer by means of a metal conductor formed on the insulating layer.

5. A semiconductor device as claimed in claim 3 wherein the said other metal layer is electrically connected to the shielding layer via the said surface zone connected to the said other metal layer and via a connecting surface region of the opposite conductivity type which connects the said surface zone to the shielding layer.

6. A semiconductor device as claimed in claim 5 wherein at least three surface zones located side by side are present which are connected alternately to the said one and the said other metal layer, the metal layers forming an interdigital pattern and a channel region being present between each two sequential surface zones, the surface zones connected to the said other metal layer being connected through connecting regions to the shielding layer which is located beneath the said one metal layer.

7. A semiconductor device as claimed in claim 1 wherein the channel region lies under a surface semiconductive region of the one conductivity type which is adjacent to the said portion of the one conductivity type and thus constitutes part of the gate electrode of the said field effect transistor.

8. A circuit for amplifying electrical signals and including a semiconductor device as claimed in claim 1 wherein the circuit includes an input, an output, and a part common to the input and output, means are provided connecting the shielding layer and the said other metal layer common to the input and output, means are provided for applying the signals to be amplified to the gate electrode, and means are provided for deriving the amplified signals from the connection to the said one metal layer under which the shielding layer is present.

References Cited

UNITED STATES PATENTS

| | | | |
|---|---|---|---|
| 3,414,740 | 12/1968 | Dailen et al. | 307—304 |
| 3,373,323 | 3/1968 | Wolfrum et al. | 317—235 |

JAMES D. KALLAM, Primary Examiner

S. BRODER, Assistant Examiner

PO-1050
(5/69)

UNITED STATES PATENT OFFICE
CERTIFICATE OF CORRECTION

Patent No. 3482152 Dated December 2, 1969

Inventor(s) A. M. R. VAN IERSEL

It is certified that error appears in the above-identified patent and that said Letters Patent are hereby corrected as shown below:

Col. 1, line 32, change "field effect transistor." to read --field effect transistor structure.--

Col. 1, line 33, change "cludes structure the source" to read --cludes the source--.

Col. 1, line 40, change "extend" to read --extends--.

Col. 6, line 52, change "decouped" to read --decoupled·

Signed and sealed this 28 th day of July , 1970.

(SEAL)
Attest:

Edward M. Fletcher, Jr.
Attesting Officer

WILLIAM E. SCHUYLER, JR.
Commissioner of Patents